United States Patent
Guzek et al.

(10) Patent No.: US 8,035,218 B2
(45) Date of Patent: Oct. 11, 2011

(54) MICROELECTRONIC PACKAGE AND METHOD OF MANUFACTURING SAME

(75) Inventors: John S. Guzek, Chandler, AZ (US); Mahadevan Survakumar, Gilbert, AZ (US); Hamid R. Azimi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/590,138

(22) Filed: Nov. 3, 2009

(65) Prior Publication Data

US 2011/0101516 A1 May 5, 2011

(51) Int. Cl.
*H01L 23/48* (2006.01)
*H01L 29/40* (2006.01)

(52) U.S. Cl. ........ 257/700; 257/686; 257/691; 257/692; 257/698; 257/773; 257/778; 257/E23.01; 257/E23.062; 257/E23.067; 257/E23.079; 438/107; 438/108; 438/125

(58) Field of Classification Search .................. 257/686, 257/691, 692, 698, 700, 773, 778, E23.01, 257/E23.062, E23.067, E23.079; 438/107, 438/108, 125
See application file for complete search history.

(56) References Cited

U.S. PATENT DOCUMENTS

| | | | |
|---|---|---|---|
| 5,281,151 A * | 1/1994 | Arima et al. | 439/68 |
| 6,323,735 B1 | 11/2001 | Welland et al. | |
| 6,724,638 B1 * | 4/2004 | Inagaki et al. | 361/763 |
| 7,141,883 B2 | 11/2006 | Wei et al. | |
| 7,649,252 B2 * | 1/2010 | Sakai et al. | 257/700 |
| 2003/0218235 A1 | 11/2003 | Searls et al. | |
| 2004/0066617 A1 * | 4/2004 | Hirabayashi et al. | 361/683 |

(Continued)

FOREIGN PATENT DOCUMENTS

WO 2011/056306 A2 5/2011

OTHER PUBLICATIONS

Skeete et al. "Integrated Circuit Packages Including High Density Bump-Less Build Up Layers and a Lesser Density Core or Coreless Substrate" U.S. Appl. No. 11/860,922, filed Sep. 25, 2007, 19 pages.

(Continued)

*Primary Examiner* — Dao Nguyen
(74) *Attorney, Agent, or Firm* — Kenneth A. Nelson

(57) ABSTRACT

A microelectronic package includes a first substrate (120) having a first surface area (125) and a second substrate (130) having a second surface area (135). The first substrate includes a first set of interconnects (126) having a first pitch (127) at a first surface (121) and a second set of interconnects (128) having a second pitch (129) at a second surface (222). The second substrate is coupled to the first substrate using the second set of interconnects and includes a third set of interconnects (236) having a third pitch (237) and internal electrically conductive layers (233, 234) connected to each other with a microvia (240). The first pitch is smaller than the second pitch, the second pitch is smaller than the third pitch, and the first surface area is smaller than the second surface area.

12 Claims, 3 Drawing Sheets

U.S. PATENT DOCUMENTS

| | | | |
|---|---|---|---|
| 2004/0238942 A1* | 12/2004 | Chakravorty et al. | 257/700 |
| 2005/0045986 A1 | 3/2005 | Koo et al. | |
| 2006/0103011 A1 | 5/2006 | Andry et al. | |
| 2006/0180924 A1 | 8/2006 | Andry et al. | |
| 2007/0194427 A1 | 8/2007 | Choi et al. | |
| 2008/0237828 A1 | 10/2008 | Yang | |
| 2008/0265406 A1 | 10/2008 | Andry et al. | |
| 2009/0001550 A1 | 1/2009 | Li et al. | |

OTHER PUBLICATIONS

International Search Report and Written Opinion received for PCT Application No. PCT/US2010/049457, Mailed on Jun. 7, 2011, 12 pages.

International Search Report and Written Opinion received for PCT Application No. PCT/US2010/049521, Mailed on Apr. 28, 2011, 9 pages.

* cited by examiner

MICROELECTRONIC PACKAGE AND METHOD OF MANUFACTURING SAME

FIELD OF THE INVENTION

The disclosed embodiments of the invention relate generally to packaging for microelectronic devices, and relate more particularly to the distribution of electrical wiring within high density microelectronic packages.

BACKGROUND OF THE INVENTION

Integrated circuit dies and other microelectronic devices are typically enclosed within a package that, among other functions, enables electrical connections to be made between the die and a socket, a motherboard, or another next-level component. As die sizes shrink and interconnect densities increase, such electrical connections must be scaled so as to match both the smaller pitches typically found at the die and the larger pitches typically found at the next-level component.

An existing approach to interconnect scaling within microelectronic packages is to use a single high density interconnect (HDI) substrate to handle the space transformation from die bump pitch, where a typical pitch value may be 150 micrometers (microns or µm) to system board level pitch, where a typical pitch value may be 1000 µm, i.e., 1.0 millimeter (mm). This approach results in very fine line, space, and via design rules to enable die routing and very large substrate body sizes in order to interface at the system board level pitch.

BRIEF DESCRIPTION OF THE DRAWINGS

The disclosed embodiments will be better understood from a reading of the following detailed description, taken in conjunction with the accompanying figures in the drawings in which.

Figure 1:
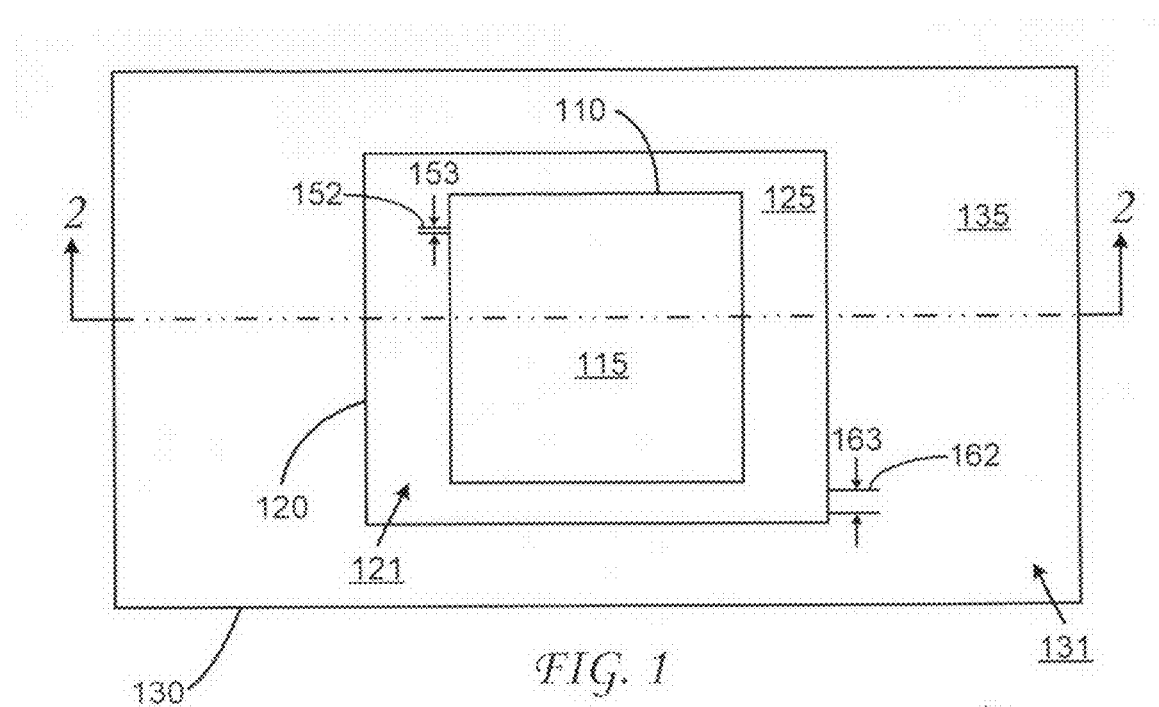
FIG. 1 is a plan view of a microelectronic package according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a microelectronic package comprises a first substrate having a first surface area and a second substrate having a second surface area. The first substrate comprises a first set of interconnects having a first pitch at a first surface thereof and a second set of interconnects having a second pitch at a second surface thereof. The second substrate is coupled to the first substrate using the second set of interconnects and comprises a third set of interconnects having a third pitch and first and second internal electrically conductive layers that are connected to each other with a microvia. The first pitch is smaller than the second pitch, the second pitch is smaller than the third pitch, and the first surface area is smaller than the second surface area.

It was mentioned above that existing microelectronic packaging solutions employ HDI substrates to handle the space transformation from die bump pitch to system board level pitch. The cost structure of the HDI substrate is largely determined by the technology required to achieve the minimum—and more expensive to implement—design rules. However, these minimum design rules are really only needed in the area under the die shadow and in the first few millimeters of signal routing from the die edge. In the existing approach, therefore, the cost is driven by the requirements of only about 20% of the total area of the substrate.

Embodiments of the invention involve a combination of HDI substrate and HDI printed circuit board (PCB) technologies that results in a packaging solution—useful for central processing unit (CPU) and chipset packaging and the like—that is much more cost-effective than the existing packaging solutions described above. To accomplish this, embodiments of the invention break the space transformation into two levels, each with fundamentally different cost structures. The system level interface is handled by a first substrate manufactured using HDI PCB design rules and materials. The die level interface is handled by a second substrate, the size of which may be restricted to the minimum required to support an interconnect at the HDI PCB substrate level, manufactured using more restrictive die level design rules and materials. Because the cost of the die level design rules may exceed that of the PCB design rules by a factor of ten ore more, embodiments of the invention yield a cost structure that is significantly less than that of existing techniques.

Embodiments of the invention may enable especially significant value, in terms of both cost savings and other factors, in the environment of high-end server CPU or graphics processing unit (GPU) packaging technology. Such technology areas require very large form factors and layer counts to meet product requirements, resulting in a very expensive HDI substrate under existing packaging processes. By breaking the packaging space transformation across two substrates, as described in detail below, an overall lower cost structure can be achieved.

In certain embodiments of the invention the first and second substrates are manufactured and attached to each other before the die is attached in the final package. This allows defects in the substrate layers and elsewhere to be yielded out without wasting good die, thus reducing cost and increasing efficiency. Additionally, die and substrate manufacturing can be done in parallel, which reduces throughput time.

Figure 2:
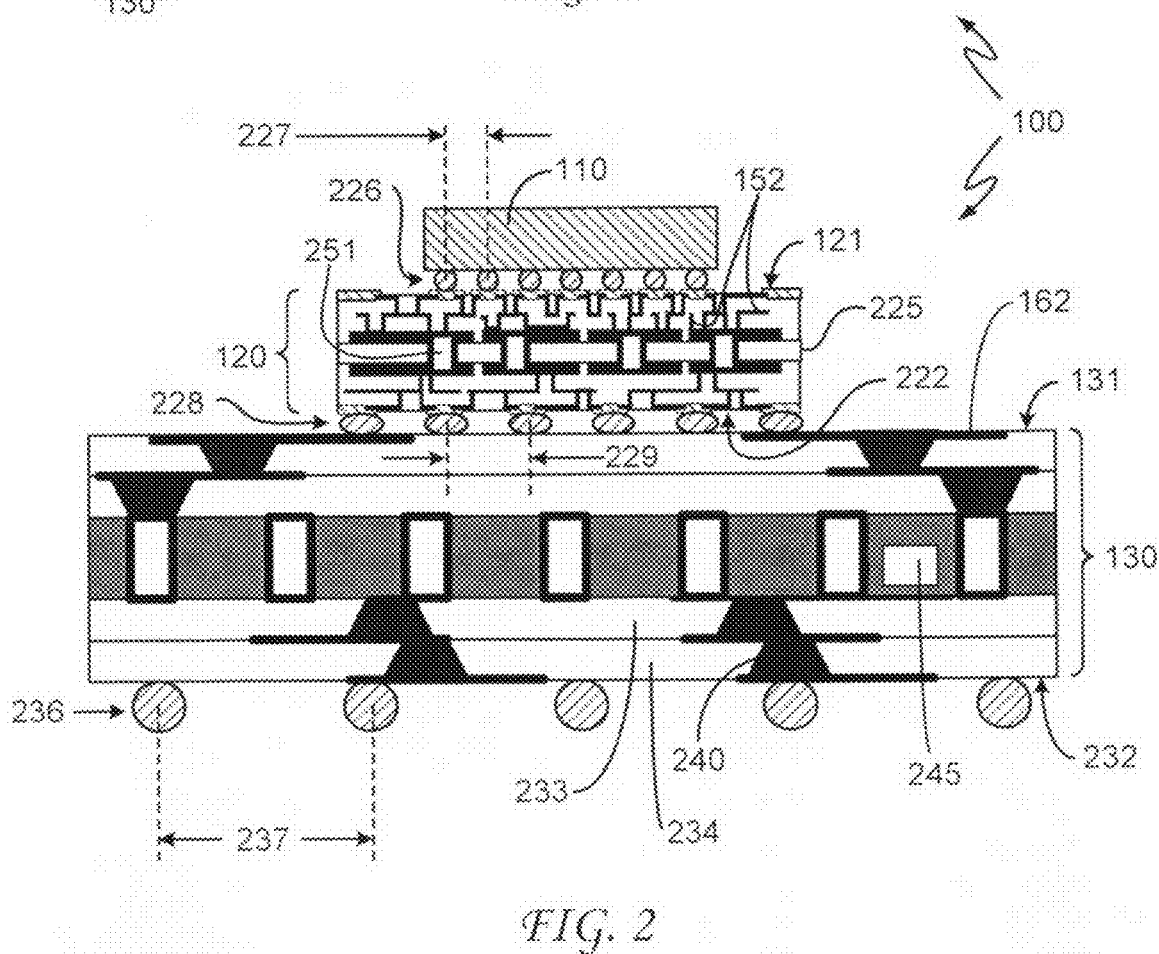
FIG. 2 is a cross-sectional view of the microelectronic package of FIG. 1 according to an embodiment of the invention.

Referring now to the drawings, FIG. 1 is a plan view and FIG. 2 is a cross-sectional view of a microelectronic package 100 according to an embodiment of the invention. As illustrated in FIGS. 1 and 2, microelectronic package 100 comprises a microelectronic die 110, a substrate 120, and a substrate 130. Substrate 120 has a surface 121 with a surface area 125, a surface 222 opposite surface 121, a set of interconnects 226 having a pitch 227 at surface 121, and a set of interconnects 228 having a pitch 229 at surface 222. Substrate 130 has a surface 131 with a surface area 135, a surface 232 opposite surface 131, a set of interconnects 236 having a pitch 237, and internal electrically conductive layers 233 and 234 that are connected to each other with a microvia 240.

Pitch 227 is smaller than pitch 229, pitch 229 is smaller than pitch 237, and surface area 125 is smaller than surface area 135. Accordingly, substrate 120 has fine line, space, and via design rules that allow connection to die 110 at typical controlled collapse chip connect (C4) pitches. Substrate 120 redistributes the input/output (IO), power, and ground bumps coming from die 110 to a larger pitch coarse enough to be mounted on an HDI PCB substrate represented by substrate 130. As has been described, substrate 130, in addition to interfacing at a particular pitch with substrate 120 on one side, interfaces at a larger pitch with a socket or motherboard or the like on the other side. According to embodiments of the invention, a combination of substrates 120 and 130, which combination may be referred to as a substrate assembly, may serve as the "substrate" in a CPU or chipset package.

It should be noted that microvia 240, in accordance with traditional usage of that term, is a connection running only between two adjacent layers within substrate 130. This distinguishes it from a plated through hole, or PTH, which runs through an entire stack of substrate layers.

Die 110 is coupled to substrate 120 using interconnects 226, and substrate 130 is coupled to substrate 120 using interconnects 228. Interconnects 236 may connect microelectronic package 100 with a motherboard or the like (not shown) via a socket or similar component (also not shown). The socket connections may be of any suitable type, including pin grid array (PGA), land grid array (LGA), ball grid array (BGA).

Interconnects 226, being the interconnects that form the first level of connections coming out of die 110, are traditionally referred to as first level interconnects, or FLI. Similarly, interconnects 236, being the interconnects that attach the die package to a motherboard or similar component, are traditionally referred to as second level interconnects, or SLI. Interconnects 228 represent a new interconnect level because they form connections to a component (substrate 120) that is not part of existing microelectronic packages. Following the naming scheme already in place for first level and second level interconnects, the phrase "mid level interconnect" ("MLI") is proposed herein as the name for interconnects 228.

A challenge facing manufacturers of microelectronic devices is developing processes capable of delivering high yielding assembly processes at fine bump pitches for large die. One process being explored is thermo-compression bonding (TCB). The TCB process will benefit from having a flexible substrate (such as a coreless substrate) rather than a thick, rigid substrate. Thus, in one embodiment, substrate 120 is a coreless substrate with no PTHs or other through holes but rather microvias connecting all layers. On the other hand, a desire for a substrate assembly having an integrated voltage regulator or the like may dictate that substrate 120 have a core. Thus, in the illustrated embodiment, substrate 120 comprises a core 225.

In certain embodiments, microelectronic package 100 further comprises an integrated passive device 245 located in at least one of substrate 120 and substrate 130. In the illustrated embodiment, integrated passive device 245 is located in substrate 130. As an example, integrated passive device 245 can serve as a component in a fully-integrated voltage regulator or the like.

In some embodiments where substrate 120 is a cored substrate, the core itself has a thickness that is no greater than 400 micrometers. In the same or other embodiments, and as illustrated in FIG. 2, substrate 120 contains a plurality of through holes 251 having a diameter that is no greater than 200 µm. In the same or other embodiments, and as illustrated in FIG. 1, substrate 120 contains electrically conductive traces 152 (only two of which are shown) that each have a thickness no greater than 15 micrometers and are separated from each other by spaces 153 that are no greater than 15 micrometers. In the same or another embodiment, substrate 130 contains electrically conductive traces 162 (only two of which are shown) that each have a thickness no greater than 75 micrometers and are separated from each other by a space 163 that is no greater than 75 micrometers.

Figure 3:
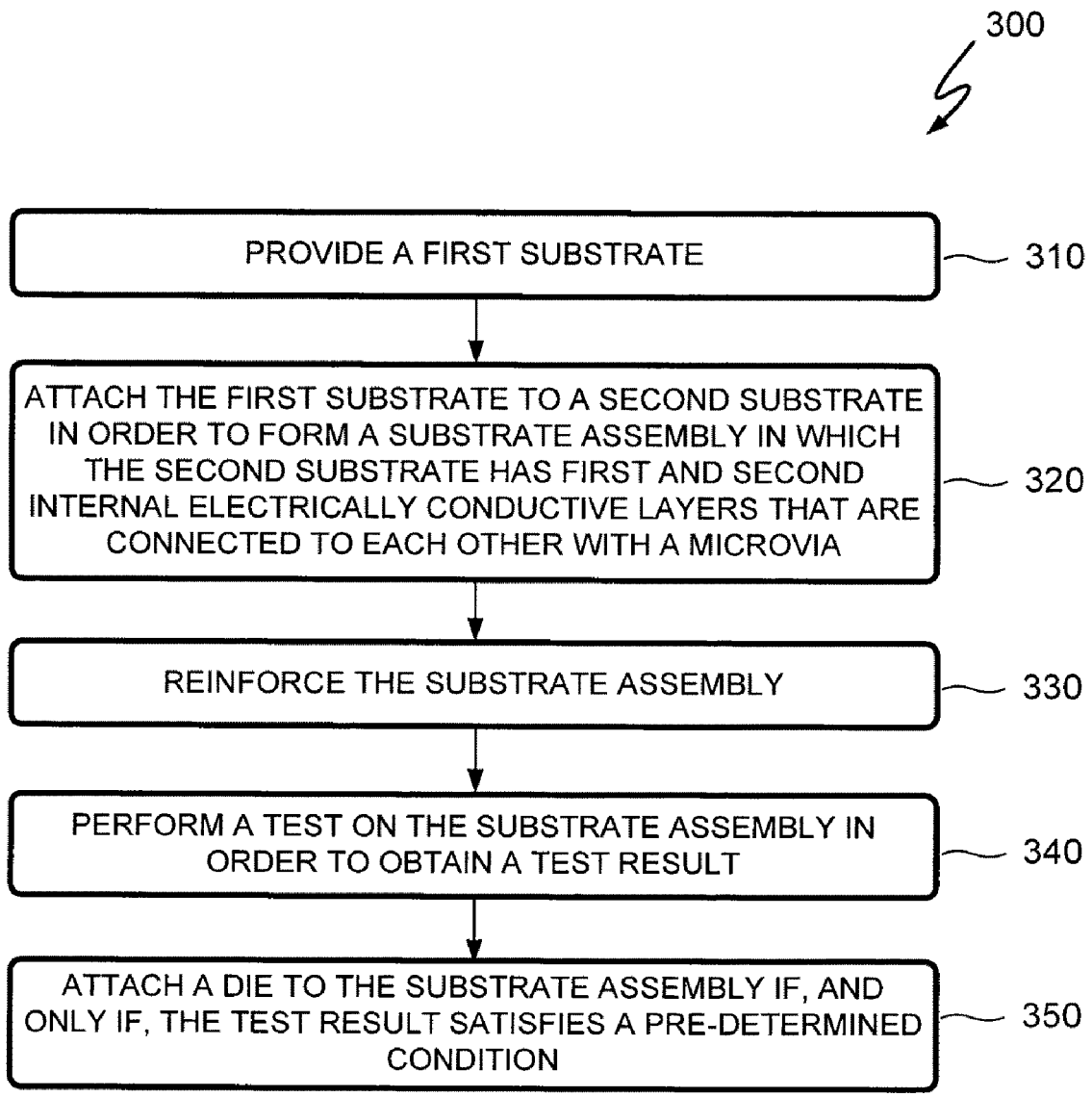
FIG. 3 is a flowchart illustrating a method of manufacturing a microelectronic package according to an embodiment of the invention.

FIG. 3 is a flowchart illustrating a method 300 of manufacturing a microelectronic package according to an embodiment of the invention. As an example, method 300 may result in the formation of a microelectronic package that is similar to microelectronic package 100 that is first shown in FIG. 1, not including die 110.

A step 310 of method 300 is to provide a first substrate. As an example, the first substrate can be similar to substrate 120 that is first shown in FIG. 1. Accordingly, in one embodiment, the first substrate has a first surface area and comprises a first set of interconnects having a first pitch at a first surface thereof and a second set of interconnects having a second pitch at a second surface thereof, and the first pitch is smaller than the second pitch.

A step 320 of method 300 is to attach the first substrate to a second substrate in order to form a substrate assembly in which the second substrate has first and second internal electrically conductive layers that are connected to each other with a microvia. As an example, the substrate assembly can represent a combination of substrates that are similar to the first substrate and the second substrate. As another example, the microvia can be similar to microvia 240 that is shown in FIG. 2. As another example, the second substrate can be similar to substrate 130 that is first shown in FIG. 1. Accordingly, in one embodiment, the second substrate has a second surface area, is coupled to the first substrate using the second set of interconnects, and comprises a third set of interconnects having a third pitch. In this embodiment, the second pitch is smaller than the third pitch and the first surface area is smaller than the second surface area.

As mentioned above, in certain embodiments of the invention substrate 120 is a coreless substrate. In at least some of those embodiments, and in other embodiments where substrate 120 is relatively thin and/or flexible, the substrate can be difficult to handle without causing damage to it. This can represent a significant challenge for coreless (and other) package assembly processes. Pre-attaching substrate 120 to substrate 130 as described in step 320 solves the rigidity issue and allows existing assembly and test methods to be used. Step 320 may be performed using standard flip chip or BGA assembly techniques.

An optional step 330 of method 300 is to reinforce the substrate assembly. As an example, optional step 330 may comprise adding an underfill material or corner glue or the like to the substrate assembly.

A step 340 of method 300 is to perform a test on the substrate assembly in order to obtain a test result. Note that this step takes place prior to die attach, leading to cost savings and other advantages as described elsewhere herein.

A step 350 of method 300 is to attach a die to the substrate assembly if, and only if, the test result satisfies a pre-determined condition. As an example, the pre-determined condition can be a favorable or passing result of a test operation.

Figure 4:
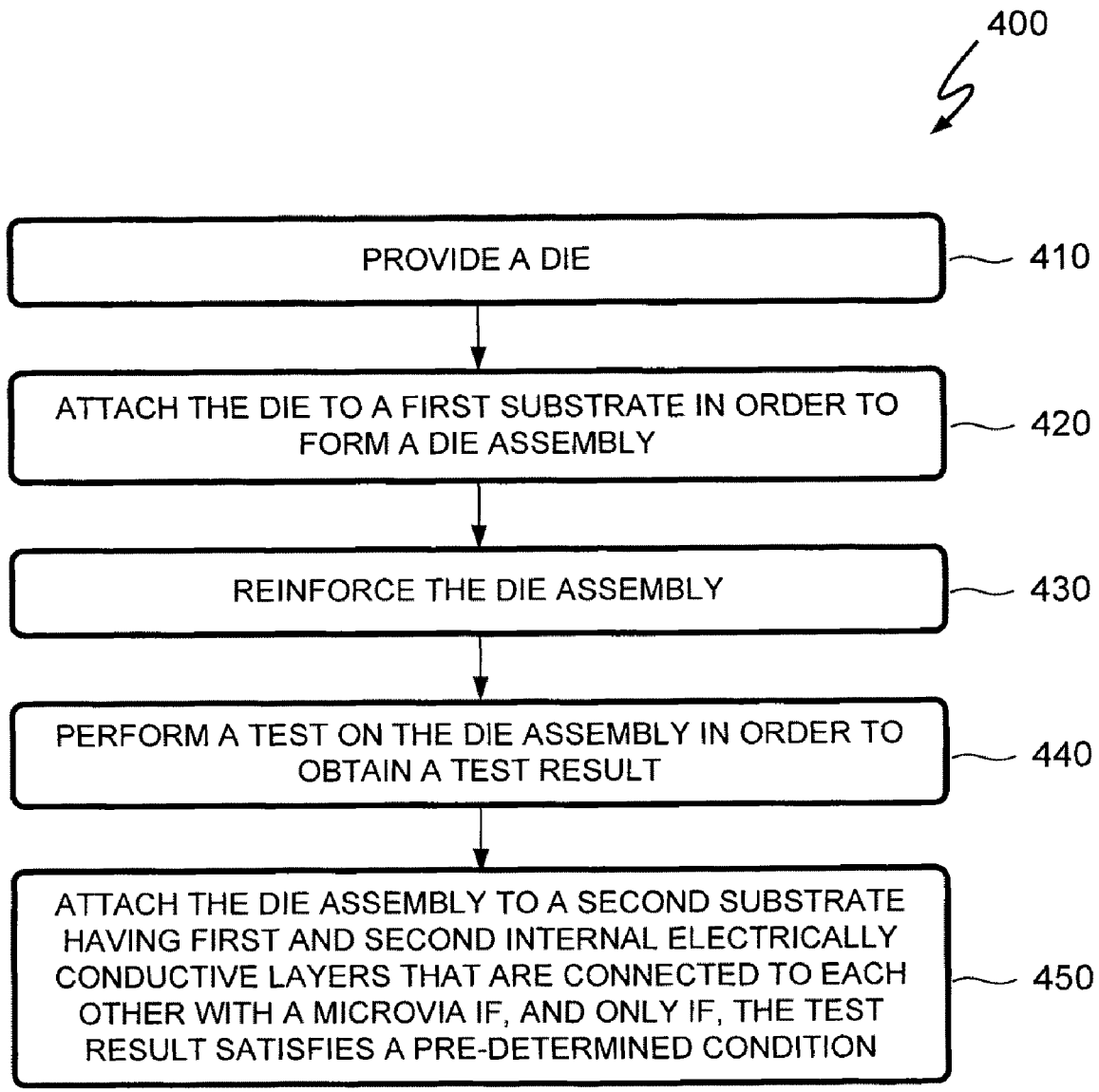
FIG. 4 is a flowchart illustrating a method of manufacturing a microelectronic package according to another embodiment of the invention.

FIG. 4 is a flowchart illustrating a method 400 of manufacturing a microelectronic package according to an embodiment of the invention. As an example, method 400 may result in the formation of a microelectronic package that is similar to microelectronic package 100 that is first shown in FIG. 1, including die 110.

A step 410 of method 400 is to provide a die. As an example, the die can be similar to die 110 that is first shown in FIG. 1.

A step 420 of method 400 is to attach the die to a first substrate in order to form a die assembly. As an example, the first substrate can be similar to substrate 120 that is first shown in FIG. 1. Accordingly, in one embodiment, the first substrate has a first surface area and comprises a first set of interconnects having a first pitch at a first surface thereof and a second set of interconnects having a second pitch at a second surface thereof, and the first pitch is smaller than the second pitch. As another example, the die assembly can be similar to the combination of the die and the first substrate.

An optional step 430 of method 400 is to reinforce the die assembly. As an example, optional step 430 may comprise adding an underfill material or corner glue or the like to the die assembly.

A step 440 of method 400 is to perform a test on the die assembly in order to obtain a test result.

A step 450 of method 400 is to attach the die assembly to a second substrate having first and second internal electrically conductive layers that are connected to each other with a microvia if, and only if, the test result satisfies a pre-determined condition. As an example, the microvia can be similar to microvia 240 that is shown in FIG. 2. As was true for method 300, the pre-determined condition, as an example, can be a favorable or passing result of a test operation.

As an example, the second substrate can be similar to substrate 230 that is first shown in FIG. 1. Accordingly, in one embodiment, the second substrate has a second surface area, is coupled to the first substrate using the second set of interconnects, and comprises a third set of interconnects having a third pitch. In this embodiment, the second pitch is smaller than the third pitch and the first surface area is smaller than the second surface area.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the microelectronic package and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A microelectronic package comprising:
    a first substrate having a first surface area and containing a first plurality of electrically conductive traces, where adjacent ones of the first plurality of electrically conductive traces are separated by a first space, the first substrate comprising a first set of interconnects having a first pitch at a first surface thereof and a second set of interconnects having a second pitch at a second surface thereof; and
    a second substrate having a second surface area and containing a second plurality of electrically conductive traces, where adjacent ones of the second plurality of electrically conductive traces are separated by a second space that is larger than the first space, the second substrate coupled to the first substrate using the second set of interconnects and comprising:
    a third set of interconnects having a third pitch; and
    first and second internal electrically conductive layers that are connected to each other with a microvia,
    wherein:
        the first pitch is smaller than the second pitch;
        the second pitch is smaller than the third pitch; and
        the first surface area is smaller than the second surface area.

2. The microelectronic package of claim 1 wherein:
    the first substrate contains a plurality of through holes having a diameter that is no greater than 200 micrometers; and the first plurality of electrically conductive traces each have a thickness no greater than 15 micrometers and the first space is no greater than 15 micrometers.

3. The microelectronic package of claim 1 wherein:
the second plurality of electrically conductive traces each have a thickness no greater than 75 micrometers and the second space is no greater than 75 micrometers.

4. The microelectronic package of claim 1 further comprising:
an integrated passive device located in at least one of the first substrate and the second substrate.

5. The microelectronic package of claim 1 wherein:
the first substrate is a coreless substrate.

6. The microelectronic package of claim 1 wherein:
the first substrate comprises a core having a thickness that is no greater than 400 micrometers.

7. A microelectronic package comprising:
a microelectronic die;
a first substrate having a first surface area and containing a first plurality of electrically conductive traces, where adjacent ones of the first plurality of electrically conductive traces are separated by a first space, the first substrate comprising a first set of interconnects having a first pitch at a first surface thereof and a second set of interconnects having a second pitch at a second surface thereof; and
a second substrate having a second surface area and containing a second plurality of electrically conductive traces, where adjacent ones of the second plurality of electrically conductive traces are separated by a second space that is larger than the first space, the second substrate coupled to the first substrate using the second set of interconnects and comprising:
a third set of interconnects having a third pitch; and
first and second internal electrically conductive layers that are connected to each other with a microvia,
wherein:
the first pitch is smaller than the second pitch;
the second pitch is smaller than the third pitch;
the first substrate is coupled to the microelectronic die using the first set of interconnects; and
the first surface area is smaller than the second surface area.

8. The microelectronic package of claim 7 further comprising:
an integrated passive device located in at least one of the first substrate and the second substrate.

9. The microelectronic package of claim 8 wherein:
the first substrate is a coreless substrate.

10. The microelectronic package of claim 8 wherein:
the first substrate comprises a core having a thickness that is no greater than 400 micrometers.

11. The microelectronic package of claim 7 wherein:
the first substrate has a thickness that is no greater than 400 micrometers;
the first substrate contains a plurality of through holes having a diameter that is no greater than 200 micrometers; and
the first plurality of electrically conductive traces each have a thickness that is no greater than 15 micrometers and the first space is no greater than 15 micrometers.

12. The microelectronic package of claim 11 wherein:
the second plurality of electrically conductive traces each have a thickness no greater than 75 micrometers and the second space is no greater than 75 micrometers.

* * * * *